United States Patent
Saed

(10) Patent No.: US 7,327,192 B2
(45) Date of Patent: Feb. 5, 2008

(54) ADAPTIVE PREDISTORTION FOR A TRANSMIT SYSTEM WITH GAIN, PHASE AND DELAY ADJUSTMENTS

(75) Inventor: Aryan Saed, Ottawa (CA)

(73) Assignee: Zarbana Digital Fund LLC, Wilmington, DE (US)

( * ) Notice: Subject to any disclaimer, the term of this patent is extended or adjusted under 35 U.S.C. 154(b) by 0 days.

(21) Appl. No.: 11/539,034

(22) Filed: Oct. 5, 2006

(65) Prior Publication Data

US 2007/0080749 A1    Apr. 12, 2007

Related U.S. Application Data

(60) Division of application No. 11/332,505, filed on Jan. 13, 2006, which is a continuation of application No. 10/641,374, filed on Aug. 13, 2003, now Pat. No. 7,015,752, which is a continuation-in-part of application No. 10/613,856, filed on Jul. 3, 2003, now Pat. No. 6,975,167.

(51) Int. Cl.
   *H03F 1/26*    (2006.01)
(52) U.S. Cl. .................. 330/149; 330/107; 330/136
(58) Field of Classification Search ................ 330/149, 330/107, 136
   See application file for complete search history.

(56) References Cited

U.S. PATENT DOCUMENTS

| | | | |
|---|---|---|---|
| 5,650,758 A | 7/1997 | Xu et al. | |
| 5,699,383 A * | 12/1997 | Ichiyoshi | 375/297 |
| 5,880,633 A | 3/1999 | Leizerovich et al. | |
| 6,043,707 A | 3/2000 | Budnik | |
| 6,072,364 A | 6/2000 | Jeckeln et al. | |
| 6,075,412 A | 6/2000 | Bainvoll | |
| 6,141,390 A * | 10/2000 | Cova | 375/297 |
| 6,208,207 B1 | 3/2001 | Cavers | |
| 6,211,733 B1 | 4/2001 | Gentzler | |
| 6,246,286 B1 | 6/2001 | Persson | |
| 6,342,810 B1 | 1/2002 | Wright et al. | |
| 6,388,518 B1 | 5/2002 | Miyatani | |
| 6,734,731 B2 * | 5/2004 | Cavers et al. | 330/149 |

(Continued)

FOREIGN PATENT DOCUMENTS

EP    0930699    7/1999

(Continued)

OTHER PUBLICATIONS

Faulkner, Michael, "Adaptive Linearization Using Predistortion—Experimental Results", IEEE Transactions on Vehicular Technology, pp. 323-332, vol. 43, No. 2, May 1994.

*Primary Examiner*—Patricia Nguyen
(74) *Attorney, Agent, or Firm*—Stolowitz Ford Cowger LLP

(57) ABSTRACT

Systems and methods relating to the provision of gain, phase and delay adjustments to signals to be used by a predistortion subsystem. A portion of an input signal is delayed by delay elements prior to being received by the predistortion subsystem. The delayed input signal portion is also received by a feedback signal processing subsystem that adjusts the gain and phase of the feedback signal based on the delayed input signal portion. The adjusted feedback signal is used, along with the delayed portion of the input signal, to determine an appropriate predistortion modification to be applied to the input signal.

8 Claims, 7 Drawing Sheets

U.S. PATENT DOCUMENTS

| | | | |
|---|---|---|---|
| 6,904,267 B2* | 6/2005 | Hongo et al. | 455/114.3 |
| 6,943,627 B2* | 9/2005 | Leyonhjelm et al. | 330/149 |
| 6,980,604 B2 | 12/2005 | Kubo et al. | |
| 2001/0054974 A1 | 12/2001 | Wright | |
| 2002/0034260 A1 | 3/2002 | Kim | |
| 2002/0101937 A1 | 8/2002 | Antonio et al. | |

FOREIGN PATENT DOCUMENTS

| | | |
|---|---|---|
| EP | 1170858 | 1/2002 |
| EP | 1 212 278 | 5/2003 |
| WO | WO 01/05026 | 1/2001 |
| WO | WO 01/56146 | 8/2001 |

* cited by examiner

ADAPTIVE PREDISTORTION FOR A TRANSMIT SYSTEM WITH GAIN, PHASE AND DELAY ADJUSTMENTS

CROSS-REFERENCE TO RELATED APPLICATIONS

The present application is divisional of U.S. application Ser. No. 11/332,505, filed Jan. 13, 2006, which in turn is a continuation of U.S. application Ser. No. 10/641,374 filed Aug. 13, 2003, now U.S. Pat. No. 7,015,752, which in turn is a continuation-in-part of U.S. application Ser. No. 10/613,856 filed Jul. 3, 2003, now U.S. Pat. No. 6,975,167.

FIELD OF THE INVENTION

The present invention relates generally to power amplification systems and is specifically applicable but not limited to power amplification systems using a Chireix architecture.

BACKGROUND TO THE INVENTION

The recent revolution in communications has caused a renewed focus on wireless technology based products. Mobile telephones, handheld computers, and other devices now seamlessly communicate using wireless technology. One component that forms the core of such technology is the amplifier. Wireless devices require high efficiency amplifiers to not only extend the range of their coverage but also to conserve the limited battery power that such devices carry.

One possible architecture which maybe used for such a power amplifier is called a Chireix architecture. Named after Henry Chireix who first proposed such an architecture in the 1930s, the Chireix architecture has fallen out of favor due to its seemingly inherent limitations. However, it has recently been revisited as it provides some advantages that other architectures do not have.

While the Chireix architecture provides some advantages, the process which the input signal undergoes also introduces some drawbacks. Specifically, distortions are introduced into the signal by the components in the Chireix based amplifier/modulator system. These distortions may also change over time and may therefore lead to a time-varying "drift" or change in the signal. Such distortions, time-varying or not, have led to problems that are not only inconvenient but expensive as well.

Based on the above, there is therefore a need for an amplifier system which provides the benefits of a Chireix based amplifier but which also compensates for or avoids the distortions which a Chireix based amplifier introduces. Such an amplifier system should adjust to differing conditions, preferably with little or no user intervention. It is therefore an object of the present invention to provide alternatives which mitigate if not overcome the disadvantages of the prior art.

SUMMARY OF THE INVENTION

The present invention provides systems and methods relating to the provision of gain, phase and delay adjustments to signals to be used by a predistortion subsystem. A portion of an input signal is delayed by delay elements prior to being received by the predistortion subsystem. The delayed input signal portion is also received by a feedback signal processing subsystem that adjusts the gain and phase of the feedback signal based on the delayed input signal portion. The adjusted feedback signal is used, along with the delayed portion of the input signal, to determine an appropriate predistortion modification to be applied to the input signal.

In a first aspect, the present invention provides a system for processing an input signal, the system comprising:
  an adaptive predistortion subsystem for receiving said input signal and for producing a predistorted signal by applying a deliberate predistortion to said input signal;
  a signal processing subsystem receiving and processing said predistorted signal and producing a system output signal;
  a feedback signal processing subsystem for receiving and processing a feedback signal derived from said system output signal; and
  a delay subsystem for providing a delay to a replica of said input signal to produce a delayed signal, said delayed signal being used by said adaptive predistortion subsystem and said feedback processing subsystem, wherein
  said adaptive predistortion subsystem distorts said input signal to compensate for distortions in said system output signal;
  said signal processing subsystem decomposes said predistorted signal into separate components, each of said separate components being processed separately;
  said processing subsystem combines said components after processing to produce said system output signal;
  an output of said feedback processing subsystem being used by said adaptive predistortion subsystem;
  said deliberate predistorfion applied to said input signal by said adaptive predistortion subsystem to produce said predistorted signal is adjusted based on said system output signal.

In a second aspect the present invention provides a method of processing an input signal to produce a system output signal, the method comprising:
  a) receiving said input signal;
  b) applying a deliberate predistortion to said input signal to result in a predistorted signal, said deliberate predistortion being based on characteristics of said system output signal;
  c) decomposing said predistorted signal into at least two component signals;
  d) combining said at least two component signals to produce said system output signal;
  e) adjusting said deliberate predistortion based on said system output signal
  f) concurrent with steps b)-e), executing the following steps:
    f1) delaying a replica of said input signal;
    f2) diverting a diverted replica of said system output signal to a feedback path;
    f3) processing said diverted replica to produce a corrected version of said diverted replica; and
    f4) determining said deliberate predistortion using said corrected version and said replica of said input signal.

In a third aspect the present invention provides an adaptive predistortion subsystem for use with a signal processing system which produces a system output signal, the predistortion subsystem comprising:
  determining means for determining a deliberate predistortion to be applied to an input signal;
  adjustment means for applying said deliberate predistortion to said input signal;

update means for periodically updating said determining means based on said system output signal wherein said adaptive predistortion subsystem uses an output of a delay subsystem for delaying said input signal and an output of a feedback processing subsystem for processing a feedback signal derived from said system output signal to determine said deliberate predistortion.

In a fourth aspect the present invention provides a method of initializing a phase correction to be applied to a feedback signal, said feedback signal to be used in determining a deliberate predistortion for a signal processing system, the method comprising:

a) initiating a coarse delay search b) selecting a time window of W samples of said feedback signal and an input signal with a predetermined sample delay increments of $\delta$ between samples c) calculating an inner product $P_\delta$ by performing a complex multiply and accumulate process for the W samples in the time window d) storing a maximum $|P_\delta|$ found e) repeating steps c) and d) for subsequent time windows and incrementing $\delta$ by a predetermined amount for each time window f) repeating steps b)-e) for a fine delay search using fractional sample increments to cover a predetermined delay range, said delay range being centered on a maximum delay increment $\delta_{max}$ found during said coarse delay search.

BRIEF DESCRIPTION OF THE DRAWINGS

A better understanding of the invention will be obtained by considering the detailed description below, with reference to the following drawings in which.

DETAILED DESCRIPTION

For clarity, the following terms are to be used with the following definitions:

AM (amplitude modulation) refers to the AM of an RF (radio frequency) signal and is equal to the magnitude of the RF signal's complex base band equivalent PM (phase modulation) refers to the PM of an RF signal and is equal to the phase of the RF signal's complex base band equivalent.

Figure 1:
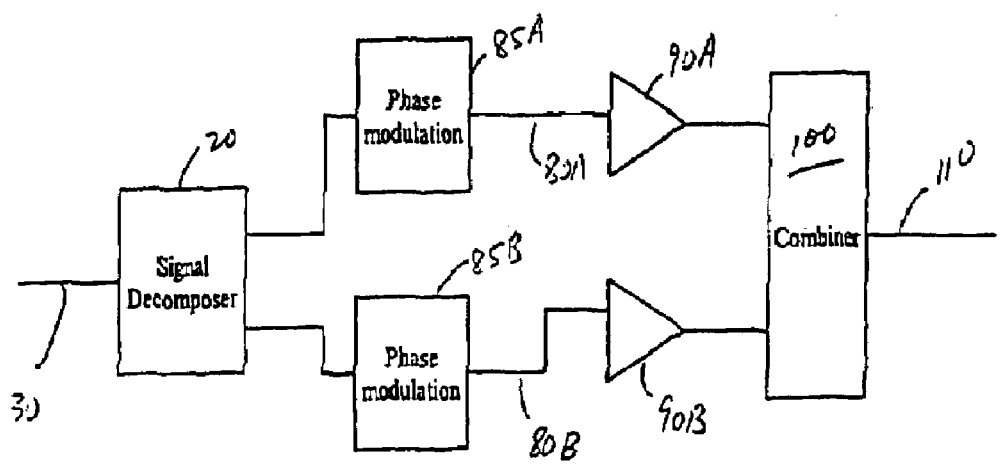
FIG. 1 is a block diagram of a Chireix architecture amplifier subsystem.

Referring to FIG. 1, a block diagram of a Chireix architecture amplifier subsystem 10 is illustrated. A signal decomposer 20 receives an input complex baseband signal 30. Phase modulated signals 80A, 80B are produced after the decomposed output of the decomposer 20 are phase modulated by phase modulation circuitry 85A, 85B. These phase modulated signals 80A, 80B are received by power amplifiers 90A, 90B. The phase modulated signals are thus amplified by the power amplifiers 90A, 90B and are received by a signal combiner 100. The system output signal 110 (an RF signal corresponding to the input baseband signal 30) is output from the combiner 100 and is an amplified and modulated version of the input signal 30. Phase modulation of the phase modulated signals 80A, 80B is executed by the signal decomposer 20. The input signal 30 is separated into at least two components and these at least two components, after phase modulation, are the signals 80A, 80B.

Figure 2:
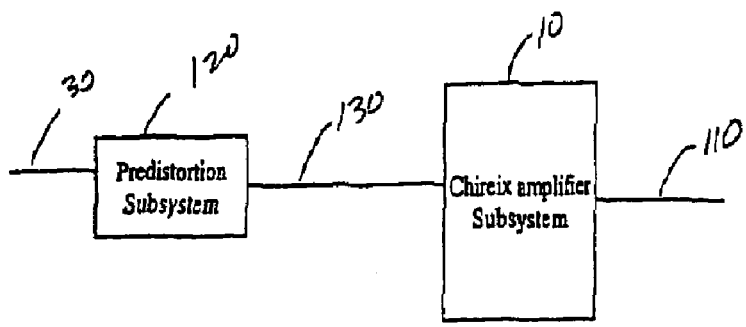
FIG. 2 is a block diagram of an amplifier system using the subsystem of FIG. 1 and a predistortion subsystem.

As noted above, the Chireix architecture amplifier subsystem 10 has been known to introduce distortions in the system output signal 110. To compensate for such distortions, a predistortion subsystem 120 is provided. Referring to FIG. 2, the predistortion subsystem 120 receives the input signal 30 and produces a predistorted signal 130. The predistorted signal 130 is received by the amplifier subsystem 10. The amplifier subsystem then produces the system output signal 110.

The distortions for which the predistortion subsystem is to compensate may come as a phase distortion, a magnitude distortion, or as a combination of both. It has been found that, without predistortion, the system output signal 110 has an amplitude modulation (AM) that is not equal to the expected and desired AM. Furthermore, the phase modulation (PM) of the system output signal 110, if predistortion is not present, deviates from the expected and desired PM. Experiments have found that the AM distortion or error (magnitude distortion) depends on the AM of the input signal. Also, it has been found that the PM distortion (or phase distortion) depends on the AM of the input signal.

As noted above, one solution to the above issues is to predistort the input signal as detailed in FIG. 2. Further details on this approach can be found in co-pending application entitled Predistortion Circuit For a Chireix Power Amplifier Transmit System and filed with the US Patent and Trademark Office, the whole of which is incorporated herein by reference. While the predistortion solution does work, it is not as robust and as fault tolerant as may be desirable. An adaptive predistortion subsystem 200, as illustrated in FIG. 3, would compensate for changing conditions and for other distortions which the system output signal may have.

Figure 3:
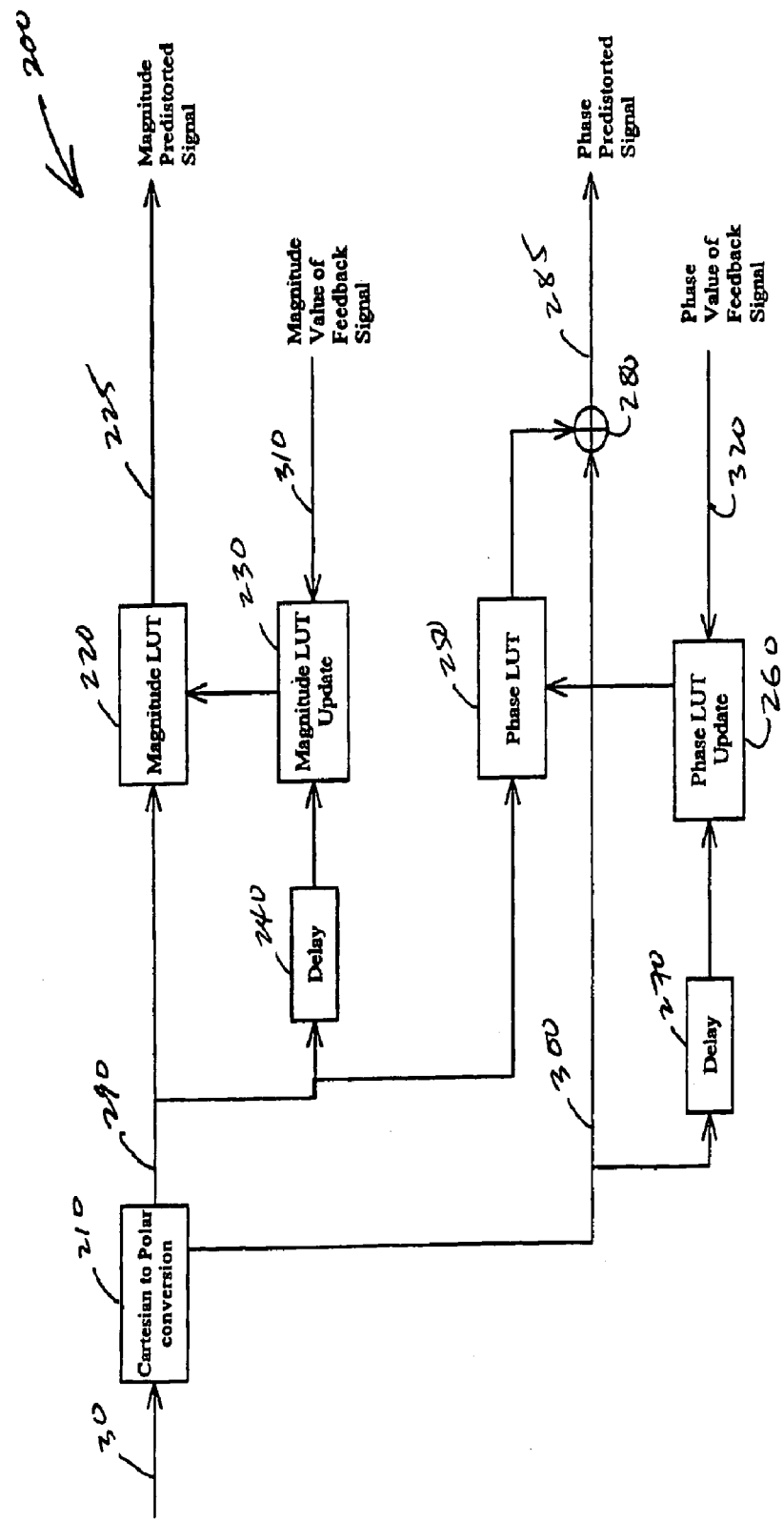
FIG. 3 is a detailed block diagram of the internal components of the predistortion subsystem.

Referring to FIG. 3, a block diagram of such an adaptive predistortion subsystem is illustrated. The adaptive predistortion subsystem 200 of FIG. 3 maybe used in place of the predistortion subsystem 120 of FIG. 2.

While an analog implementation of the subsystem 200 is possible, it has been found that a digital implementation was simpler to achieve. As such, the following description assumes that the input signal 30 is a digital signal having a digital representation of the desired AM and PM of the desired output RF signal. Digital AM/AM predistortion modifies the magnitude of the complex digital input signal such that the RF output signal has the desired AM, despite the distortion. Digital AM/PM predistortion modifies the phase of the complex digital input signal such that the RF output has the desired PM, despite the distortion.

As can be seen in FIG. 3, multiple components are involved in the adaptive predistortion subsystem 200: a Cartesian to polar conversion unit 210, a magnitude value lookup table (LUT) block 220, a magnitude update block 230, a magnitude delay block 240, a phase value lookup table (LUT) block 250, a phase value update block 260, a phase delay block 270, and an adder 280. The digital input signal 30 is converted by the conversion unit 210 from Cartesian coordinates to polar coordinates. The magnitude of the converted signal is then received and used by the lookup table blocks 220, 250 to determine the proper amount of predistortion to be applied. The phase lookup table 250 adds the phase distortion to the converted signal by way of the adder 280. The predistorted signal is then passed on to the amplifier subsystem 10.

It should be noted that the predistortion modification, defined as any deliberate distortion which has been introduced to the input signal to change at least the phase or magnitude of the input signal, can take many forms. FIG. 3, provided merely for illustrative purposes, depicts two types of predistortion—phase predistortion and magnitude predistortion. These two types, separately or together, can make up the predistortion modification. In some applications, only a magnitude type predistortion modification may be required while in others only a phase type predistortion modification is required. In the embodiment explained here, the two types of predistortion, together comprise the predistortion modification.

To account for changing conditions and to acquire appropriate LUT entries, a feedback mechanism is employed to adjust or adapt the lookup table entries in lookup table blocks 220, 250. Delay blocks 240, 270 ensure that the feedback sample is mated with the proper value of the input signal waveform when processing and updating the lookup table entries in lookup table blocks 220, 250.

The conversion unit 210, while present, is not necessary but merely convenient and makes the predistortion easier to accomplish. As is well known, signal representations using Cartesian coordinates take the form of $z=x+jy$ where x and y are the real and imaginary components. Polar coordinates take the form of $z=Ae^{j\phi}$ where the magnitude of the signal is A and its phase is $\phi$. Since both the magnitude and the phase of the signal is to be modified by the predistortion subsystem, it is clearly more convenient to accomplish this if the signal were in polar coordinates. Again as is well known, $A=(x^2+y^2)^{1/2}$ while $\phi=\tan^{-1}(y/x)$. Once the signal has been converted into polar coordinates, adjusting the magnitude is as simple as replacing the digital representation of A by another number. Similarly, the phase can be adjusted by adding a phase correction to the phase of the signal.

After the digital input signal is received and converted by the conversion unit 210, the signal is now represented by two values—a magnitude value 290 and a phase value 300. FIG. 3 shows the different signal paths followed by these values—one path for the magnitude value 290 and a second path for the phase value 300.

As noted above, the magnitude value 290 can be easily replaced by the predistorted magnitude value. This is done by way of magnitude lookup table block 220. The lookup table internal to the magnitude lookup table block 220 represents an input/output relationship with the input being the undistorted magnitude and the output being the predistorted signal magnitude. Thus, if the magnitude LUT block 220 has a table entry with an input value of 0.5 and an output value of 0.4, then if the undistorted magnitude value received by the magnitude LUT block 220 is 0.5, then this value is replaced with 0.4 as the output of the magnitude LUT block 220. Based on the LUT (lookup table) entries, the magnitude of the undistorted signal is therefore replaced with the desired predistorted magnitude.

Similar to the above, the phase value of the converted input signal is adjusted as well. As can be seen in FIG. 3, the magnitude value 290 is also received by the phase lookup table block 250. The phase lookup table block 250, based on the magnitude value, determines the proper amount of phase adjustment and adds this phase adjustment to the phase value 300 by way of the adder 280. The phase lookup table block 250 also has a lookup table resident within the phase LUT block 250 that details the appropriate phase adjustments for given magnitude values.

While the above described magnitude LUT replaces a desired value for the received magnitude, other implementations are possible. Instead of a direct replacement value, the magnitude LUT may provide a corrective value to the received magnitude. This corrective value can, depending on the implementation, be an additive or a multiplicative corrective value.

Figure 4:
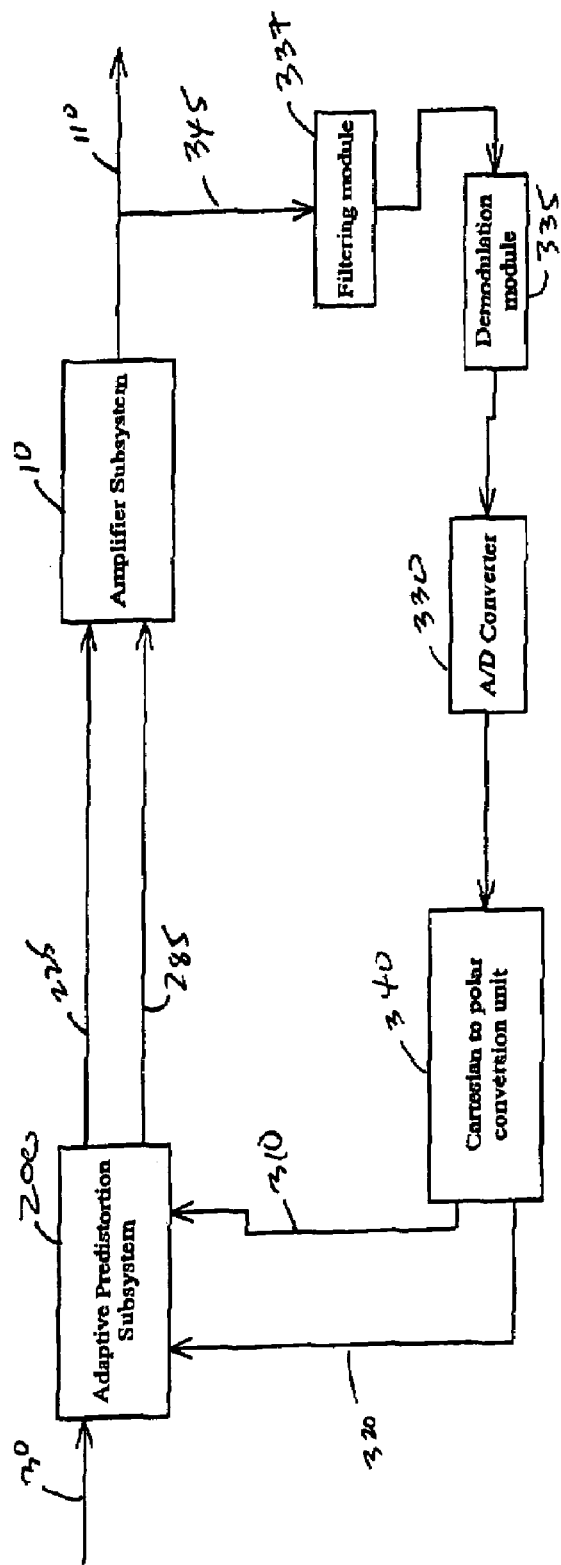
FIG. 4 illustrates the amplifier system of FIG. 2 and incorporating a feedback signal used by the predistortion subsystem of FIG. 3.

The adaptive predistortion subsystem 200 in FIG. 3 is adaptive in that the values of the lookup table entries in the lookup table (LUT) blocks 220, 250 change over time to account for changing conditions or for acquiring appropriate LUT entries. This adaptability is implemented by way of a feedback signal tapped from the system output signal 110. Referring to FIGS. 3 and 4, two feedback signals, a magnitude feedback signal 310 and a phase feedback signal 320, are received by the magnitude value update block 230 and by the phase value update block 260 respectively. These two feedback signals result from processing of the system output signal 110 by the analog/digital (A/D) converter 330, the Cartesian to polar conversion unit 340, demodulation module 335, and filtering module 337. As can be seen in FIG. 4, the system output signal (an analog signal) is tapped and this tapped signal 345 is received by the A/D converter 330 for conversion from an analog to a digital signal.

After conversion to a digital signal, the feedback signal is converted from Cartesian to polar coordinates by the conversion unit 340. The tapped signal 345 is thus represented by the two feedback signals—the magnitude feedback signal 310 and the phase feedback signal 320. As mentioned above, both these feedback signals are received by their respective update blocks 230, 260.

Once the two digital feedback signals are received, they are then compared with the delayed input signal coming from the delay blocks 240, 270. The updated values for the LUT entries are then calculated and entered into their respective lookup tables. It should be noted that the comparison may be done by subtracting the feedback signals from the delayed input signal.

To further elaborate on the above process, the update process is dependent on the difference between the tapped system output signal 345 and the input signal 30. This difference is, of course, taken after both signals are in polar coordinates. The magnitude and phase errors are defined as:

$$e_m(k)=|z(k)|-|x(k)|$$

$$e_\phi(k)=(\angle z(k)-\angle x(k))$$

where $e_m(k)$=magnitude error $e_\phi(k)$=phase error z(k)=magnitude of feedback signal (signal 310)

x(k)=magnitude of input signal (signal 290)

$\angle z(k)$=phase angle of feedback signal (signal 320)

$\angle x(k)$=phase angle of input signal (signal 300)

For the magnitude LUT entries in the magnitude LUT block 220, two variables are defined and used in the process:

$$\delta_F=-\mu_F \cdot e_m(k)$$

where
- $\delta_F$=update quantity dependent on the differences between the magnitudes of the input signal and the feedback signal
- $\mu_F$=an update speed parameter $\mu$ (user selectable), typically $\mu_F>0$.

Since the magnitude LUT has LUT entries, each entry is given an entry address of n with $0 \leq n \leq -1$, N being the maximum number of entries in the internal magnitude LUT in the magnitude LUT block 220.

An interpolation distance s is defined as $s=\alpha M-n$ where $n=\lfloor \alpha M \rfloor$ (or the largest integer value less than or equal to $\alpha M$), $M=|x(k)|$, and $\alpha$ is a scaling value applied such that the magnitude range (e.g. $0 \leq M<1$) is mapped to a table index range $0 \leq n \leq (-1)$.

The table entries are thus updated using the following formulae (n being one table address and n+1 being another table address):

$$F_n(k+1)=F_n(k)+(1-s)\cdot\delta_F \text{ iff } 0\leq n\leq(-1)$$

$$F_{n+1}(k+1)=F_{n+1}(k)+(s)\cdot\delta_F \text{ iff } 0\leq n+1\leq(-1)$$

where
- $F_n(k)$=table entry n for time sample k
- $F_n(k+1)$=table entry n for time sample k+1
- $F_{n+1}(k)$=table entry for n+1 for time sample k
- $F_{n+1}(k+1)$=table entry n_1 for time sample k+1

From the above equations, it should be clear that one, two or no entries in the internal magnitude LUT are updated depending on the value of $\alpha M$. Thus, for this implementation, depending on the value of $\alpha M$, one of $F_n$ and $F_{n+1}$ is updated, both are updated, or neither is updated. Other implementations, depending on the circumstances and needs of the particular application, may update other numbers of entries.

For the phase LUT entires, an analogous process is used in the phase update block 260. An update quantity is defined:

$$\delta_G=-\mu_G\cdot e_\phi(k)$$

where
- $\delta_G$=update quantity dependent on the differences between the phase angles of the input signal and of the system output signal
- $\mu_G$=an update speed parameter (user selectable) where $0\leq\mu_G<1$ Using the parameter s as defined above for the magnitude LUT, the phase LUT entires can be updated using the following formulas:

$$G_n(k+1)=G_n(k)+(1-s)\cdot\delta_G \text{ iff } 1\leq n\leq(-1)$$

$$G_{n+1}(k+1)=G_{n+1}(k+1)+(s)\cdot\delta_G \text{ iff } 1\leq n\leq N$$

Again, much like the magnitude LUT entry update process, the update process for the phase entries will, depending on the value of $\alpha M$, update one, two, or none of the phase LUT entries.

It should be noted that LUT adaptation may involve updating more than two entries with some weighting applied. As an example, the weighting may depend upon the distance of the LUT entry from the update point. The discussion herein is based upon the use of two entries and the use of an interpretation distance.

As an example of the above processes, a phase entry update will be illustrated. For this example, the following values are assumed:
- N=6
- M≦1
- α=5
- x(k)=0.35 exp(j·2·7)
- z(k)=0.2exp(j·3·1)
- $\mu_G$=0.1

Thus, M=0.35 and αM=1.75. Thus, n=1 (since the lowest integer value less than or equal to 1.75=1) and n+1=2. From these values, s=1.75-1=0.75. Given that z(k)=0.2 exp(j·2.3), the $e_\phi(k)$=-0.4. Thus, $\delta_G$=-(0.1)(-0.4)=+0.04. The required correction for $G_1$ is therefore $(1-s)\cdot\delta_G$=(1-0.75)(+0.04)=0.25·(+0.04)=0.01. For $G_2$, the correction is $s\cdot\delta_G$=(0.75)(0.04)=0.03. The new values are therefore:

$$G_1(k+1)=G_1(k)+0.01$$

$$G_2(k+1)=G_2(k)+0.03$$

This update is illustrated by the values in the following table:

| Address (n) | LUT content before update | Correction | LUT content after update |
|---|---|---|---|
| 0 | −1 | 0 | −1 |
| 1 | 2 | 0.01 | 2.01 |
| 2 | −0.5 | 0.03 | −0.47 |
| 3 | −0.5 | 0 | −0.5 |
| 4 | 0.5 | 0 | 0.5 |
| 5 | 2 | 0 | 2 |

It should be noted that the above process also takes into account the lookup of values that are not to be found in the internal lookup tables. Linear interpolation using $s=\alpha M-n$ is used for magnitude values that cannot be found in the lookup table entries. As an example, if the magnitude is given as 0.35 but the only table entries are 0.3 and 0.4, linear interpolation is used. The following formula is used to find values not found in the lookup tables:

$$F(M)=(1-s)\cdot F_n+s\cdot F_{n+1}$$

where
- $F_n$=table value A
- $F_{n+1}$=table value B with the desired value being between table values A and B
- $n=\lfloor \alpha M \rfloor$ (the largest integer value less than or equal to $\alpha M$)
- $s=\alpha M-n$
- $\alpha$=scaling value as defined above.

From the above discussion, it should be fairly clear that two of the values underpinning most of the calculations are the values for $e_m(k)$ and $e_\phi(k)$, the magnitude and phase errors. While the equations above for these two values will provide acceptable answers, better results may be had by taking into account the phase, magnitude, and delay effects of the feedback signal (i.e. the tapped system output signal 345). However, to be able to do this, the input signal must be properly delayed so that samples from the interpolated input waveform, as obtained from the delayed input signal samples, are mated with the relevant system output signal sample. Such proper delaying should therefore take into account most, if not all, the time delay involved in the processing production, and feedback of the system output signal (round trip delay). This round trip delay is denoted as τ (seconds) and, before the LUT updating begins, the delay blocks 240, 270 acquires the delay and delays the input signal accordingly so as to time-align the input signal samples with the incoming feedback signal.

To implement this delay, a delay line is used with a depth of K, meaning K samples of the input signals may be stored in the delay line. As should be clear, each of the K samples were sampled at different instances in time. The value of K is predetermined and should be enough to allow for the maximum possible path delay between the input signal and the feedback signal. These delays are due to a combination of any of the following: digital pipelining, analog and digital filter group delays, analog propagation delays, and the system and implementation dependent delays.

Because of this delay, a time delayed version of the input signal, $x_\delta(k)$ is defined and this is ideally $$x_\delta(k) = x(k-\delta)$$

where
$\delta = \tau \cdot F_s$
$F_s$ = signal sampling rate
$\tau$ = delay (normal trip delay between input and system output signal feedback)

To obtain a better result for $x_\delta(k)$, linear interpolation is used to allow for fractional values of $\delta$. Thus, the delay is divided into two parts $\kappa$, the integer part of the sample (representing a discrete sample delay at the sample rate $F_s$), and $\nu$, a fractional sample of the delay.

Using this notation, the delayed portion of the input signal can be represented as:

$$x_\delta(k) = (1-\nu) \cdot x(k-\kappa) + \nu \cdot x(k-\kappa+1)$$

where
$\delta = \tau \cdot F_s$
$\kappa = \lfloor \delta \rfloor$
$\nu = \delta - \kappa$ As can be seen, for an integer $\delta$, $x_\delta(k) = x(k-\delta)$.

The above Cartesian equation can be applied to polar representations by having separate delay lines for magnitude ($|x_\delta(k)|$) and phase ($\angle x_\delta(k)$) using the sequences $|x(k)|$ and $\angle x(k)$. These are given by:

$$\angle x_\delta(k) = (1-\nu) \cdot \angle x(k-\kappa) + \nu \cdot \angle x(k-\kappa+1)$$

$$|x_\delta(k)| = (1-\nu) \cdot |x(k-\kappa)| + \nu \cdot |x(k-\kappa+1)|$$

It should be fairly clear that $x_\delta(k)$ is calculated from the samples $x(k), x(k-1), x(k-2), \ldots x(k-\kappa)$, samples of the input signal taken at time $k, k-1, k-2, \ldots k-\kappa$.

The above equations for $\angle x_\delta(k)$ has a peculiarity that is due to the way angle values work. Since $\angle x(k-\kappa)$ and $\angle x(k-\kappa+1)$ are represented by modulo $2\pi$ radians (360 degrees) and since $-\pi \leq \angle x(k) \leq \pi$, then errors could easily occur.

Thus, if $-\pi \leq \angle x(k) \leq \pi$, and if $|\angle x(k-\kappa+1) - \angle x(k-\kappa)| \geq \pi$, then $$\angle x_\delta(k) = (1-\nu) \cdot \angle x(k-\kappa) + \nu \cdot (\angle x(k-\kappa+1) + 2\pi) \text{ if } \angle x(k-\kappa+1) \leq \angle x(k-\kappa)$$

$$\angle x_\delta(k) = (1-\nu) \cdot \angle x(k-\kappa) + \nu \cdot (\angle x(k-\kappa+1) - 2\pi) \text{ if } \angle x(k-\kappa+1) > \angle x(k-\kappa)$$

Figure 5:
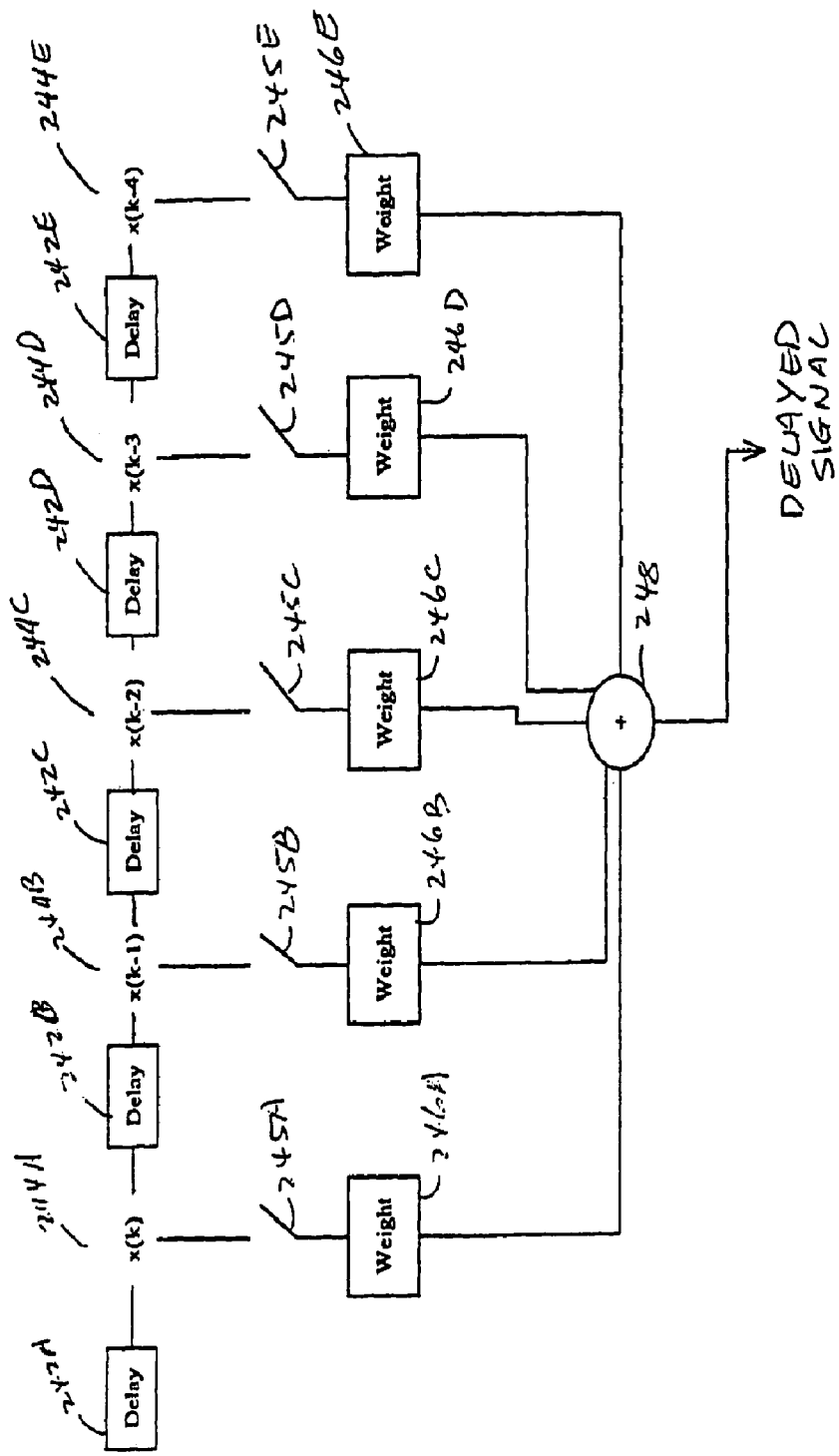
FIG. 5 is a block diagram of a delay line circuit which may be used in the system of FIG. 4.

The above described delay can be implemented by cascaded delay elements and associated sample storage. FIG. 5 illustrates such a delay subsystem which can be used as delay blocks 240, 270. As can be seen, delay elements 242A, 242B, 242C, 242D, 242E are cascaded and provide delays and storage for input signal samples 244A, 244B, 244C, 244D, 244E. Switches 245A, 245B, 245C, 245D, 245E allow any one of the signal samples 244A-244E to be switched so that it can be used. These samples 244A-244E can be weighted accordingly by programmable weighting blocks 246A, 246B, 246C, 246D, 246E. The weighted samples are then summed up by adder 248 to produce the delayed signal 249 to be used by the system. The switches 245A . . . 245E and the values in the weighting blocks 246A . . . 246E may be user/system controllable so that any combination of weighted samples maybe produced.

As an example, if $\tau \cdot F_s = 2.4$ samples is required, then a value of 0.6 is used by the weighting block 246C and a value of 0.4 is used by the weighting block 245D. Then, by closing switches 245C and 245D then the sample $x(k-2.4)$ is obtained.

The phase correction required for the feedback portion of the system output signal is also dependent on the delayed signal $x_\delta(k)$. The complex phase difference between the delayed signal $x_\delta(k)$ and the system output signal $z(k)$, represented by $\gamma$, is due in part to the round trip delay and to other factors. The phase correction and delay can be found by executing the following process:

1. Reset the running-maximum register. set $P_{max} = 0$
2. Reset the phase correction: set $\gamma = 0$
3. Preset the variable interpolating delay line (discussed above as a delay subsystem):set $\delta = \delta_0$ (i.e. $\kappa = \kappa_0$ and $\nu = \nu_0$)
4. Perform a coarse search: select only interpolating delay line integer sample-delay increments of $\delta$ (maintain $\nu = \nu_0$, increment $\kappa$ only): set the coarse and fine delay increments to $\Delta\kappa = 1$ and $\Delta\nu = 0$.
5. Start with the first correlation window $n=0$. Time instance $k=0$ signifies the commencement of the search.
6. "Integrate": calculate the inner product $$P_\delta = A_{MAC} \cdot \sum_{k=n \cdot W}^{n \cdot W + W - 1} \exp(j \cdot (\angle x_\delta(k) - \angle z(k)))$$

This is a complex multiply-and-accumulate (MAC) covering a time window of W current samples. Note that the above notation strictly implies that the correlation windows $n=0, 1, 2, \ldots$ are adjoined, yet this is not an operational requirement. A spacing between windows translates to a lengthening of the search.

7. "Dump": compare the complex magnitude $|P_\delta|$ with the value $P_{max}$, and if $|P_\delta| > P_{max}$ then (a) update the maximum: set $P_{max} = |P_\delta|$
(b) update the delay: retrieve the corresponding value of $\delta$ and store it as $\delta_{max}$ and
c) update the angle: if fine searching store the angle $\gamma = \angle P_\delta$ 8. Proceed to the next window: set $n = n+1$, and increment $\delta$ by $\Delta\kappa + \Delta\nu$
9. Repeat from Step 4, until the full integer (coarse) delay range $\kappa = \kappa_0 \ldots K_\nu$ of the interpolating delay line is exhausted. ($K_\nu$ is the maximum variable delay, $\kappa_0$ is the starting coarse delay value for the search)
10. Store $\delta_{max}$ as $\delta_1$.
11. Read the programmed fine search step size $\Delta\nu$.
12. Repeat Steps 1 and 4 to 8 for the fine search: employ fractional-sample increments of $\Delta\nu$, covering the delays $\delta_1 - 1 \leq \delta \leq \delta_1 + 1$, ensuring not to exceed $0 \leq \delta \leq K_\nu$ 13. Store $\delta_{max}$ as $\delta_2$.
14. Set and freeze the interpolating delay line delay to $\delta_2$.
15. Apply the phase correction $\gamma$ Once the full course range is exhausted, the stored $\delta$ value $\delta_{max}$ is used as a starting point for a fine search. With $\Delta\kappa=0$, the $\Delta v$ is incremented fractionally so as to search the delays $\delta_1 - 1 \leq \delta \leq \delta_1 + 1$. Once found (using an analogous loop to that used for the coarse search), the phase correction $\gamma$ is found along with the proper delay value. It should be clear that $\gamma = \angle P_\delta$.

Updating of the phase LUT is only to be accomplished after the phase synchronization of the feedback signal. Freezing the phase LUT update can be done by setting $\mu F=0$ and $\mu G=0$.

After the phase correction is done, the magnitude of the feedback signal z(k) has to be adjusted as well. This adjustment is required to compensate for any gain in the system output signal relative to the input signal. Magnitude adjustment is accomplished by directly multiplying the feedback signal z(k) by a factor $A_{xx}(k)$. This is found using the following formula:

$$A_{xx}(k+1) = A_{xx}(k) + \mu_A \cdot (|x_\delta(k)| - A_{xx}(k)|z(k)|)$$

For $k_A \leq k \leq k_{A+} W_A - 1$ where
  $k_A$=commencement time for the magnitude adjustments (preferably as early as possible)
  $W_A$=number of samples for which the adjustments are performed
  $\mu_A$=update step size and $0 \leq \mu_A \leq 1$ $A_{xx}(k_A)$, $\mu_A$, and $W_A$ can be programmable.

Figure 6:
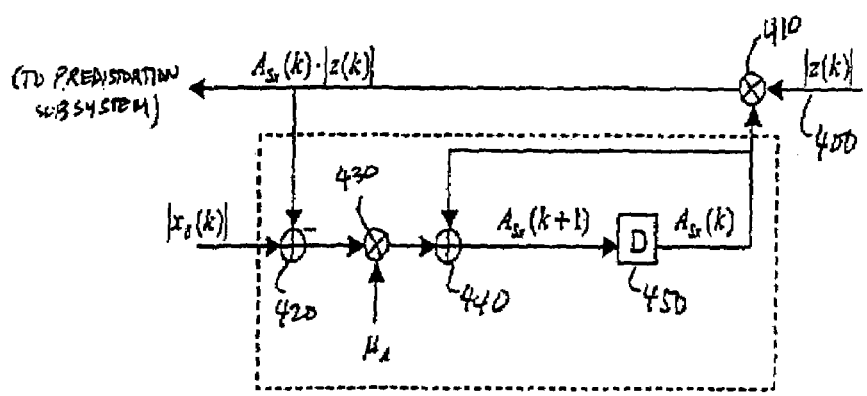
FIG. 6 is a circuit which may be used to implement the magnitude adjustment explained below.

Referring to FIG. 6, a circuit for implementing the magnitude adjustment is illustrated. As can be seen, the magnitude 400 of the portion of the system output signal is multiplied with the factor $A_{xx}(k)$ by way of multiplier 410. The result is to be used in calculating the desired predistortion modification. This result is also subtracted from the magnitude ($|x_\delta(k)|$) of the delayed signal by way of adder 420. The result of the subtraction is multiplied by the update step size $\mu_A$ by way of multiplier 430 and added to the factor $A_{xx}(k)$ by adder 440 to produce the next value in the sequence for the factor. The delay element 450 delays the resulting value until it is ready for use.

Once the delay, magnitude and phase adjustments have been made, new equations for the error signals can now be used:

$$E_m(k) = A_{xx} \cdot |z(k)| - |x_\delta(k)|$$

$$E_\phi(k) = (\gamma + \angle z(k) - \angle x_\delta(k))$$

These two error signals can therefore be used in place of the earlier ones and these take into account the effects of the delay, magnitude, and phase differences between the system output signal and the input signal.

While the above embodiment utilizes LUT entries that are adjusted based on the difference between the input signal and the system output signal, the system output signal alone may be used, if desired, in adjusting the LUT entries. This alternative would require the modulation of the system output signal and the regeneration of a signal similar to the input signal. Successful recovery is possible if the amount of distortion is restricted such that demodulation can occur without errors. This approach is not desirable if the input signal is readily available to be used in determining the parameters of the adjustments. Another alternative involves measuring the distortion by measuring the amount of out-of-band energy. Adjustments can then be made to minimize the amount of out-of-band energy and, consequently, minimize the distortion.

Figure 7:
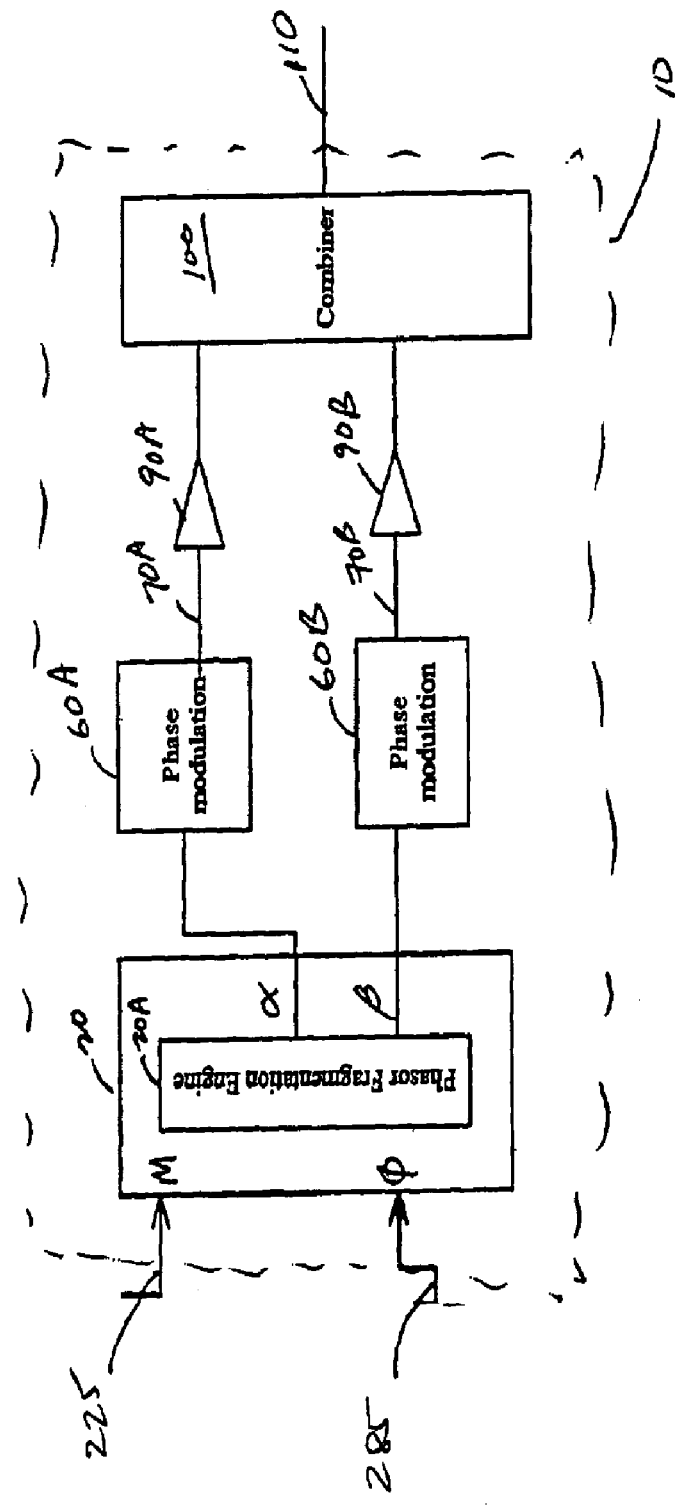
FIG. 7 is a detailed block diagram of one embodiment of a Chireix amplifier subsystem.

Regarding the amplifier subsystem 10, FIG. 7 illustrates one embodiment of the subsystem 10. In FIG. 7, the signal decomposer 20 of FIG. 1 comprises a phasor fragmentation engine 20A along with phase modulation units 60A, 60B. The fragmentation engine 20A receives the magnitude (M) and phase ($\phi$) representing the predistorted signal. The phasor fragmentation engine 20A deconstructs a predetermined modulation waveform (the predistorted signal) into signal components which are of equal and constant magnitude. Further information regarding the phasor fragmentation engines maybe found in the applicant's co-pending application U.S. application Ser. No. 10/205,743 entitled COMPUTATIONAL CIRCUITS AND METHODS FOR PROCESSING MODULATED SIGNALS HAVING NON-CONSTANT ENVELOPES, which is hereby incorporated by reference. In FIG. 7, these signal components are denoted by angles $\alpha$ and $\beta$. These components are each received by RF modulation and filtering blocks 60A, 60B which process the components to produce RF modulated and filtered versions of the components. The signal component 70A is an RF signal with phase $\alpha$ while signal component 70B is an RF signal with phase $\beta$. These components 70A, 70B are then amplified by amplifiers 90A, 90B. The amplified components are then recombined using combiner 100. It should be noted that the phase modulation, also known as carrier modulation, may also introduce some undesired amplitude modulation. Signal decomposition methods other than the phasor fragmentation referred to above may also be used by the signal decomposer 20.

Regarding the Chireix architecture amplifier subsystem 10, it has been found that, for higher amplification efficiencies, switch mode amplifiers are preferred for the amplifiers 90A, 90B. Such switch mode amplifiers, specifically Class D and Class F power amplifiers, provide low output impedances that allow higher amplification efficiencies. A co-pending application filed on Oct. 16, 2002 and having U.S. Ser. No. 10/272,725 entitled CHIREIX ARCHITECTURE USING LOW IMPEDANCE AMPLIFIERS provides further information on the desirable components and is hereby incorporated by reference. Such types of amplifiers are not required for the invention to function but they have been found to provide performance at a desirable level.

It should further be noted that while those are only two parallel amplifiers 90A, 90B in FIG. 1 and FIG. 7, multiple parallel amplifiers maybe used as long as the decomposer 20 decomposes the predistorted signal 130 into enough components so that each component is separately amplified and phase modulated in parallel with the other components.

It should also be noted that the predistortion subsystem 10 explained above does not linearize a power amplifier as is well-known in the field. Instead, the predistortion subsystem linearizes a whole power amplifier system—the output of the whole amplifier system is linearized and not simply the output of a single amplifier. Also, unlike the linearizing systems for power amplifiers that are currently known, the amplifier system discussed in this document compensates for distortions that mostly occur at mid signal amplitudes. Current single amplifier linearization systems linearize distortions that occur at large signal amplitudes.

It should further be noted that the invention maybe applied to any signal processing system which decomposes a signal into components and recombines them. It has been found that signal combiners (block 100 in FIG. 1) invariably cause distortions. These combiners use addition to recombine the components and improper signal addition, such as when recombining sinusoidal components, has been found to be one cause of the distortions in the system output signal. In the above embodiment, the phasor fragmentation engine decomposes the incoming signal into vectors and the improper addition of these vectors by the combiner 100 lead to distortions in the output signal.

Figure 8:
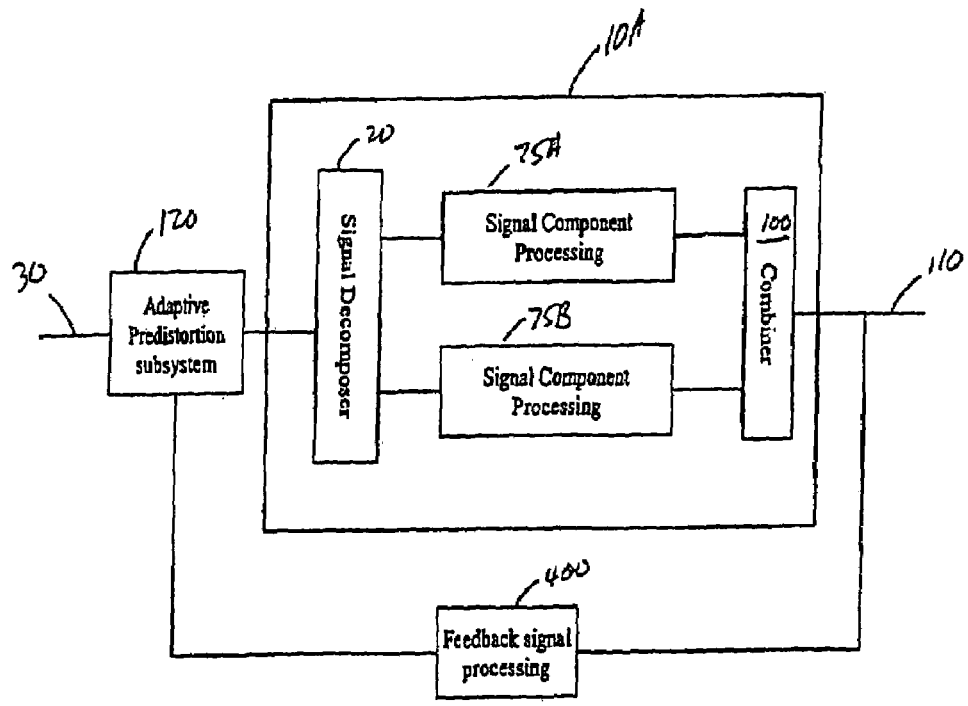
FIG. 8 is a block diagram of a signal processing system according to another embodiment of the invention.

While the above embodiment amplifies the input signal, albeit separately for each component, this need not be the only signal processing accomplished after the input signal is decomposed. Referring to FIG. 8, such a generalized system (which may be part of a larger signal transmission system) is illustrated. The predistortion subsystem 120 predistorts an incoming signal 30 and compensates for distortions introduced in the system output signal 110 by the improper or imperfect recombining of the input signals components. These components are produced by the signal decomposer 20 and are separately processed by signal component processor blocks 75A, 75B. The processing executed by the blocks 75A, 75B may take the form of amplification (as in the embodiment above), phase modulation, a combination of the two, or any other signal processing which may be desired. As an example, each of the signal components illustrated in FIG. 7 may be separately phase modulated in addition to being amplified by amplifiers 90A-90B. The phase modulation maybe accomplished separately or be incorporated in the signal decomposer or, as contemplated for the implementation illustrated in FIG. 7, incorporated into the modulation and filtering blocks 60A, 60B.

As can be seen in FIG. 8, the signal processing subsystem 10A receives the predistorted signal frm the predistortion subsystem 120. After being received, the predistorted signal is decomposed by the signal decomposer 20 into components. These components are then separately processed by the signal component processor blocks 75A, 75B and are then recombined by the recombiner 100.

A feedback signal processing block 400 receives a portion of the system output signal 110 and processes this portion so it maybe used by the adaptive predistortion subsystem 120. As an example, the feedback signal processing block 400 may contain the A/D converter 330 and the conversion unit 340 illustrated in FIG. 4. The magnitude adjustment and phase adjustment detailed above can also be implemented in this block 400.

One advantage using the above invention is that it allows less stringent tolerances to be used for the system components. Previously, components had to be substantially matched so that signal processing could produce acceptable results. By using the above invention, less than substantially matched components may be used together. Errors due to a mismatch may be measured and compensated for by the predistortion subsystem.

Figure 9:
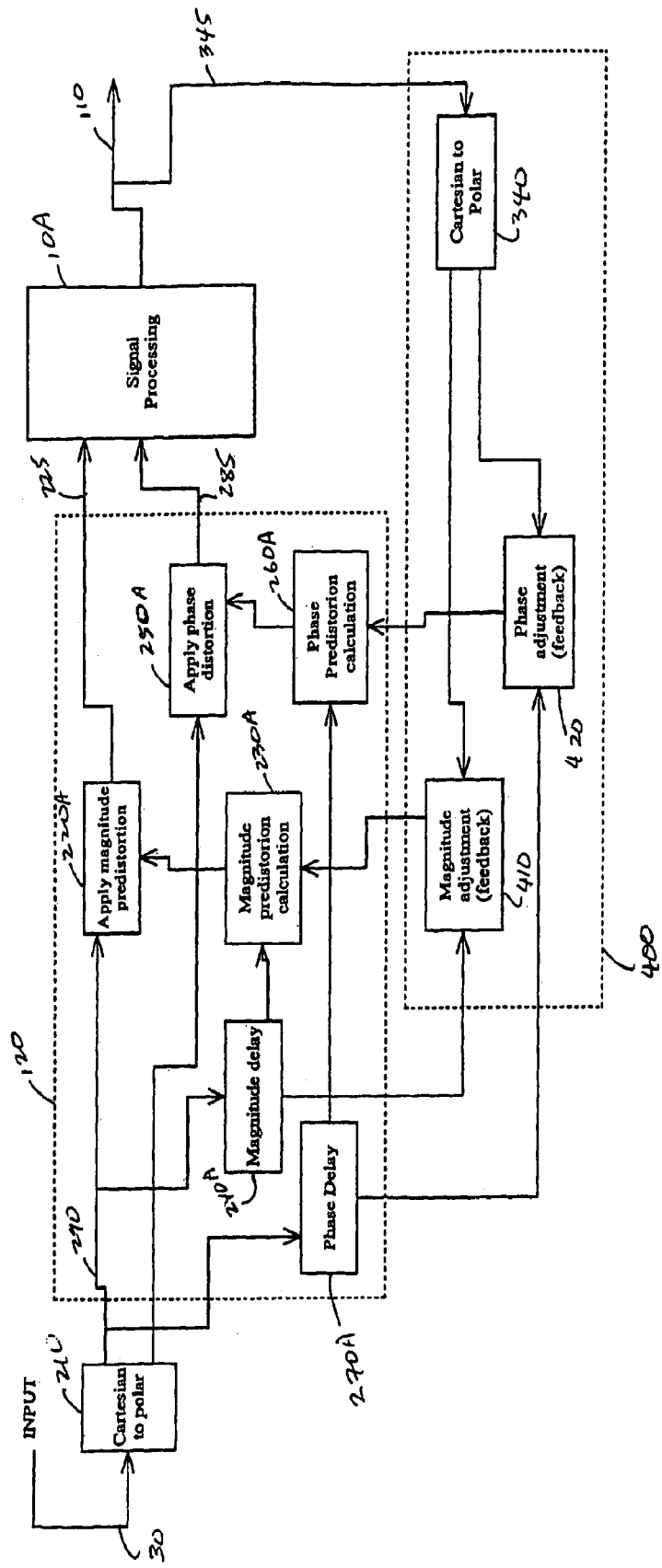
FIG. 9 is a detailed block diagram of a system incorporating the feature shown in FIGS. 3, 4 and 8.

Referring to FIG. 9, a detailed block diagram of a system incorporating the features illustrated in FIGS. 3, 4 and 8 is presented. As can be seen, the adaptive predistortion block 120 in FIG. 8 is comprised of the separate magnitude delay 240 and phase delay 270 along with a magnitude predistortion calculation block 260A. The inputs of these calculation blocks 230A, 260A are the delayed input signals from the delay blocks 240, 270 and the adjusted feedback signals from the magnitude adjustment blocks 410 and the phase adjustment block 420. After the magnitude and phase predistortion modification are calculated, then the magnitude LUT block 220A and the phase LUT block 250A apply the predistortions. It should be noted that the magnitude LUT block 220A includes the magnitude LUT 220 and the magnitude LUT update block 230 shown in FIG. 3. Similarly, the phase LUT block 250A incorporates the phase LUT 250 and the phase LUT update block 260 illustrated in FIG. 3.

As can also be seen, the feedback signal processing block 400 illustrated in FIG. 8 is comprised of the Cartesian to polar coordinate conversion block 340 which feeds the magnitude adjustment block 410 and the phase adjustment block 420.

A person understanding this invention may now conceive of alternative structures and embodiments or variations of the above all of which are intended to fall within the scope of the invention as defined in the claims that follow.

What is claimed is:

1. A method of initializing a phase correction to be applied to a feedback signal, said feedback signal to be used in determining a deliberate predistortion for a signal processing system, the method comprising:
  a) initiating a coarse delay search
  b) selecting a time window of W samples of said feedback signal and an input signal with a predetermined sample delay increments of δ between samples
  c) calculating an inner product $P_\delta$ by performing a complex multiply and accumulate process for the W samples in the time window
  d) storing a maximum $|P_\delta|$ found
  e) repeating steps c) and d) for subsequent time windows and incrementing delta by a predetermined amount for each time window
  f) repeating steps b)-e) for a fine delay search using factional sample increments to cover a predetermined delay range, said delay range being centered on a maximum delay increment $\delta_{max}$ found during said coarse delay search.

2. A method according to claim 1 wherein said inner product process is defined by $$P_\delta = A_{MAC} \cdot \sum_{k=n\cdot W}^{n\cdot W+W-1} \exp(j \cdot (\angle x_\delta(k) - \angle z(k)))$$

where
  $\angle x_\delta(k)$ is a phase of said input signal
  $\phi z(k)$ is a phase of said feedback signal
  $A_{MAC}$ is a constant
  n is an integer denoting a time window.

3. A method according to claim 1 wherein said phase correction is a phase of said maximum $P_\delta$.

4. A method according to claim 1 wherein said inner product $P_\delta$ is based on a phase of said input signal and on a phase of a system output signal.

5. An apparatus for initializing a phase correction to be applied to a feedback signal, the feedback signal to be used in determining a deliberate predistortion for a signal processing system, the apparatus comprising:
  means for initiating a coarse delay search;
  means for selecting a time window of W samples of said feedback signal and an input signal with a predetermined sample delay increments of δ between samples;
  means for calculating an inner product $P_\delta$ by performing a complex multiply and accumulate process for the W samples in the time window;
  means for storing a maximum $|P_\delta|$ found; and
  means for incrementing δ by a predetermined amount for subsequent time windows;

means for using factional sample increments for a fine delay search to cover a predetermined delay range, the delay range being centered on a maximum delay increment $\delta_{max}$ found during a coarse delay search.

6. An apparatus as claimed in claim 5 wherein the inner product is defined by $$P_\delta = A_{MAC} \cdot \sum_{k=n\cdot W}^{n\cdot W+W-1} \exp(j \cdot (\angle x_\delta(k) - \angle z(k)))$$

where
$\angle x_\delta(k)$ is a phase of said input signal
$\phi z(k)$ is a phase of said feedback signal
$A_{MAC}$ is a constant
n is an integer denoting a time window.

7. An apparatus as claimed in claim 5, wherein the phase correction comprises a phase of said maximum $P_\delta$.

8. An apparatus as claimed in claim 1, wherein the inner product $P_\delta$ is based at least in part on a phase of the input signal or on a phase of a system output signal, or combinations thereof.

* * * * *

UNITED STATES PATENT AND TRADEMARK OFFICE
CERTIFICATE OF CORRECTION

PATENT NO. : 7,327,192 B2
APPLICATION NO. : 11/539034
DATED : February 5, 2008
INVENTOR(S) : Saed It is certified that error appears in the above-identified patent and that said Letters Patent is hereby corrected as shown below:

At column 14, line 28, please replace "delta" with --$\delta$--.

At column 14, line 31, please replace "factional sample" with --fractional sample--.

At column 14, line 45, please replace "$\phi z(k)$" with --$\angle z(k)$--.

At column 15, line 1, please replace "factional sample" with --fractional sample--.

At column 16, line 3, please replace "$\phi z(k)$" with --$\angle z(k)$--.

Signed and Sealed this

Second Day of November, 2010

David J. Kappos
*Director of the United States Patent and Trademark Office*